United States Patent
Feng et al.

(10) Patent No.: US 12,189,224 B2
(45) Date of Patent: Jan. 7, 2025

(54) PANEL SUPPORT STRUCTURE, MANUFACTURING METHOD THEREOF, AND DISPLAYING DEVICE

(71) Applicants: Chengdu BOE Optoelectronics Technology Co., Ltd., Chengdu (CN); BOE Technology Group Co., Ltd., Beijing (CN)

(72) Inventors: Binfeng Feng, Beijing (CN); Bowen Xiao, Beijing (CN); Fei Li, Beijing (CN); Zhihao Xie, Beijing (CN)

(73) Assignees: Beijing BOE Technology Development Co., Ltd., Beijing (CN); Chengdu BOE Optoelectronics Technology Co., Ltd., Sichuan (CN)

( * ) Notice: Subject to any disclaimer, the term of this patent is extended or adjusted under 35 U.S.C. 154(b) by 20 days.

(21) Appl. No.: 17/352,277

(22) Filed: Jun. 19, 2021

(65) Prior Publication Data

US 2022/0167511 A1   May 26, 2022

(30) Foreign Application Priority Data

Nov. 23, 2020   (CN) .......................... 202011324514.4

(51) Int. Cl.
*G02F 1/1333*   (2006.01)
*G09F 9/30*   (2006.01)

(52) U.S. Cl.
CPC ...... *G02F 1/133305* (2013.01); *G02F 1/1333* (2013.01); *G02F 1/133308* (2013.01); *G09F 9/301* (2013.01); *G02F 2201/503* (2013.01)

(58) Field of Classification Search
CPC ............. G02F 1/1333; G02F 1/133308; G02F 1/133314; G02F 1/133317; G09F 9/301; H10K 77/111
See application file for complete search history.

(56) References Cited

U.S. PATENT DOCUMENTS

| | | |
|---|---|---|
| 2018/0182840 A1* | 6/2018 | Lin ................. H10K 59/18 |
| 2019/0157311 A1 | 5/2019 | Zhang |
| 2019/0237490 A1 | 8/2019 | Hu et al. |
| 2021/0335840 A1 | 10/2021 | Qin |
| 2022/0050321 A1 | 2/2022 | Park et al. |

(Continued)

FOREIGN PATENT DOCUMENTS

| | | |
|---|---|---|
| CN | 109212661 A | 1/2019 |
| CN | 109671718 A | 4/2019 |
| CN | 111768706 A | 10/2020 |

(Continued)

OTHER PUBLICATIONS

CN202011324514.4 first office action and search report.

*Primary Examiner* — Jessica M Merlin
(74) *Attorney, Agent, or Firm* — IPro, PLLC

(57) ABSTRACT

A panel support structure, a manufacturing method thereof, and a displaying device. The panel support structure comprises: at least one bent part comprising a through hole area and a blind hole area; the through hole area is located in the middle of the bent part, and at least one through hole is formed in the through hole area; and the blind hole area is located around the through hole area, at least one blind hole is formed in the blind hole area, and depths of the blind holes are decreased in a direction away from the through hole area.

20 Claims, 9 Drawing Sheets

(56) References Cited

U.S. PATENT DOCUMENTS

2022/0057835 A1    2/2022  Feng et al.

FOREIGN PATENT DOCUMENTS

| CN | 111862820 A | | 10/2020 | |
|----|-------------|---|---------|---|
| CN | 112863349 A | * | 5/2021 | |
| WO | 2020060134 A1 | | 3/2020 | |
| WO | WO-2020113736 A1 | * | 6/2020 | ............. G09F 9/301 |

* cited by examiner

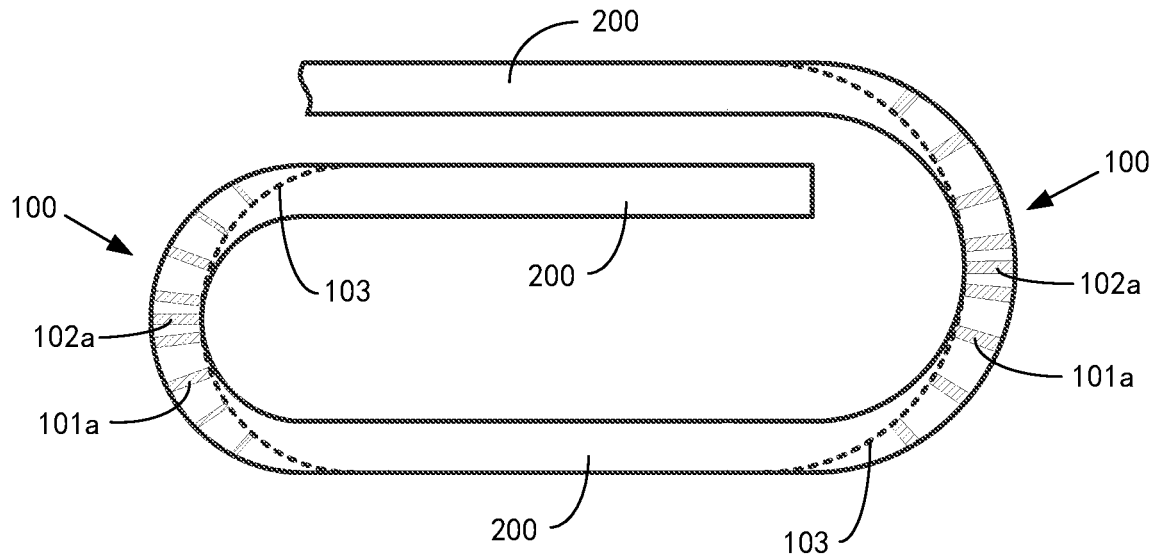

Fig. 17

| determine, according to the curvature radius of at least one bent part of a panel support structure and the thickness of the panel support structure, a guide line of the panel support structure when the bent part of the panel support structure is in a bent state | — S101 |

↓

| determine depths and distribution areas of blind holes and through holes in the panel support structure according to the guide line, wherein a through hole area is located in the middle of the bent part of the panel support structure, a blind hole area is located around the through hole area, at least one through hole is formed in the through hole area, at least one blind hole is formed in the blind hole area, and the depths of the blind holes are decreased in a direction away from the through hole area | — S102 |

↓

| etch the panel support structure according to the determined depths and distribution areas of the blind holes and the through holes | — S103 |

Fig. 18

PANEL SUPPORT STRUCTURE, MANUFACTURING METHOD THEREOF, AND DISPLAYING DEVICE

CROSS REFERENCE TO RELEVANT APPLICATIONS

The application claims priority to Chinese Patent Application No. 202011324514.4, filed in the China National Intellectual Property Administration on Nov. 23, 2020, and the title of "Panel Support Structure, Manufacturing Method Thereof, And Displaying Device", which is incorporated herein in its entirety by reference.

TECHNICAL FIELD

The application relates to the technical field of display, in particular to a panel support structure, a manufacturing method thereof, and a displaying device.

BACKGROUND

The development of display products puts forwards an ever higher requirement for the diversity of products, and curved display products or bendable display products are becoming more and more popular.

SUMMARY

The application provides a panel support structure, a manufacturing method thereof, and a displaying device.

In the first aspect, an embodiment of the application provides a panel support structure, comprising: at least one bent part comprising a through hole area and a blind hole area;

wherein, the through hole area is located in a middle of the bent part, and at least one through hole is formed in the through hole area; and the blind hole area is located around the through hole area, at least one blind hole is formed in the blind hole area, and depths of the blind holes are decreased in a direction away from the through hole area.

In the second aspect, an embodiment of the application provides a displaying device, the displaying device comprises a flexible display panel and the above panel support structure; and the flexible display panel is located on a side of the panel support structure.

In the third aspect, an embodiment of the application provides a manufacturing method of a panel support structure, comprising:

determining, according to a curvature radius of at least one bent part of the panel support structure and a thickness of the panel support structure, a guide line of the panel support structure when the bent part of the panel support structure is in a bent state;

determining depths and distribution areas of blind holes and through holes in the panel support structure according to the guide line, wherein a through hole area is located in a middle of the bent part of the panel support structure, a blind hole area is located around the through hole area, at least one said through hole is formed in the through hole area, at least one said blind hole is formed in the blind hole area, and depths of the blind holes are decreased in a direction away from the through hole area; and etching the panel support structure according to the determined depths and distribution areas of the blind holes and the through holes.

Additional aspects and advantages of the application will be given in the following description, and will become obvious from the following description or be known in the practice of the application.

The above description is only an overview of the technical solution of this disclosure, which can be implemented according to the contents of the specification in order to understand the technical means of this disclosure more clearly, and in order to make the above and other objects, features and advantages of this disclosure more obvious and understandable, the detailed description of this disclosure will be given below.

BRIEF DESCRIPTION OF THE DRAWINGS

In order to explain the technical solution in the embodiments of the disclosure or related arts more clearly, the drawings used in the description of the embodiments or related arts will be briefly introduced below. Obviously, the drawings in the following description are only some embodiments of the disclosure, and for those of ordinary skill in the art, other drawings can be obtained according to these drawings without paying creative labor.

The embodiments of the application will be described below in conjunction with the accompanying drawings to make the above and/or additional aspects and advantages of the application obvious and be easily understood, wherein:

FIG. 17 is a schematic diagram of a bent part in a U-shaped state according to a thirteenth implementation of the panel support structure provided by the embodiments of the application; and FIG. 18 is a flow diagram of a manufacturing method of a panel support structure provided by the embodiments of the application.

DETAILED DESCRIPTION

Figure 1:
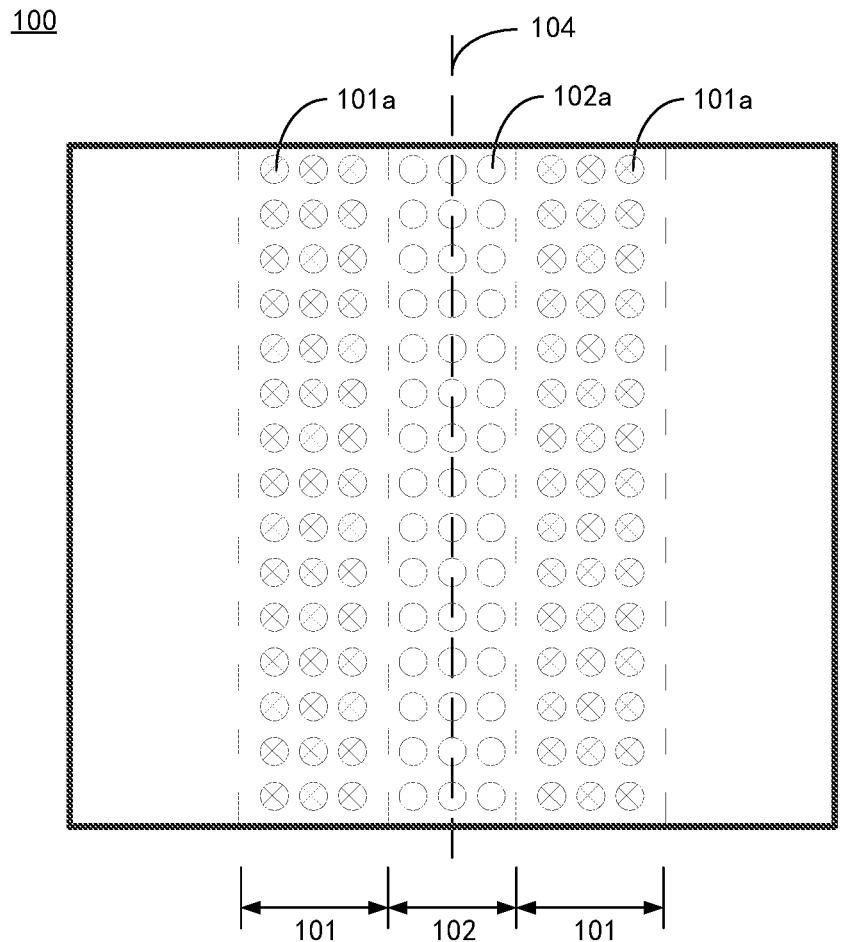
FIG. 1 is a structural diagram of a first implementation of a panel support structure provided by the embodiments of the application.

The application will be described in detail below. Examples of the embodiments of the application are shown in the accompanying drawings, in which identical or similar reference signs represent identical or similar components, or components with identical or similar functions throughout the specification. In addition, detailed descriptions of known techniques that are not indispensable to the features of the application are omitted. The embodiments described below with reference to the accompanying drawings are illustrative ones merely for the purpose of explaining the application, and should not be construed as limitations of the application.

Those skilled in the art would appreciate that all terms (including technical terms and scientific terms) in this specification should have meanings commonly understood by those ordinarily skilled in the art of the application, unless otherwise defined. It should be understood that terms defined in universal dictionaries should be construed as having meanings consistent with those in the context of the prior art, and unless otherwise specifically defined as here, there terms should not be interpreted ideally or excessively officially.

Those skilled in the art would appreciate that, unless otherwise specifically stated, the singular form "a/an", "one", "said" and "this" in the specification may include the plural form. It should be further understood that the expression "comprise" in the description of the application refers to the existence of said feature, integer, element and/or module, and shall not exclusive of the existence or addition of one or more other features, integers, elements, modules and/or combinations thereof. It should also be understood that when one element is referred to as being "connected" or "coupled" to the other element, it may directly connected or coupled to the other element, or an intermediate element may exist between the two elements. In addition, "connect" or "coupled" used here may refer to wireless connection or wireless coupling. The expression "and/or" used in this specification includes all or any one of one or more associated elements listed and all combinations of these elements.

First of all, several nouns involved in the application will be introduced and explained below:

blind hole: a via hole that connects the surface layer and the inner layer, but does not penetrates through the whole panel; and bottom of blind hole: a sealed surface, at the inner end of the whole panel, of the blind hole.

The inventor of the application finds by study that curved display products or bendable display products are typically manufactured based on flexible display panels and a panel support structure is disposed on the back of the flexible display panels to provide sufficient support strength for the flexible display panels to protect the panels against damage. However, the panel support structure may reduce the bending performance of the display products and make the bending performance of the flexible display products insufficient, which in turn restrains the curvature of the curved display products or reduces the user experience of the bendable display products.

The application provides a panel support structure, a manufacturing method thereof, and a displaying device to solve the above-mentioned technical problems of the prior art.

The technical solutions of the application and how the technical solutions of the application solve the above-mentioned technical problems will be described in detail below in conjunction with specific embodiments.

Figure 2:
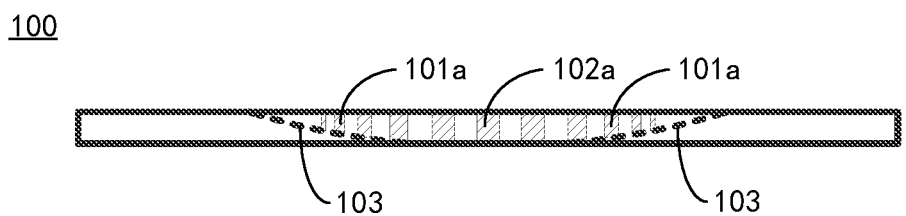
FIG. 2 is a sectional view of the first implementation of the panel support structure provided by the embodiments of the application.
Figure 3:
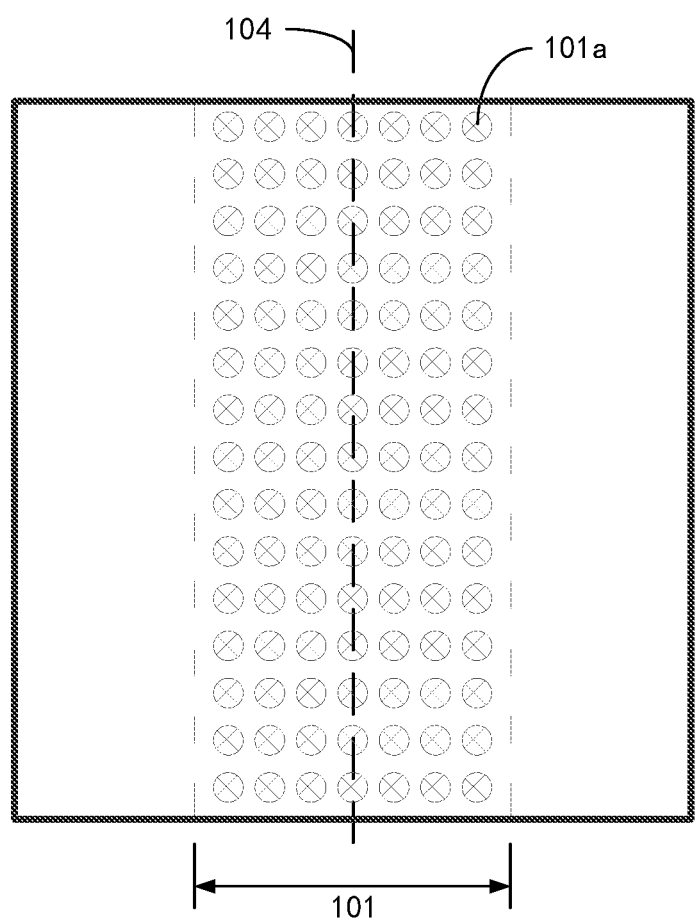
FIG. 3 is a structural diagram of a second implementation of the panel support structure provided by the embodiments of the application.
Figure 4:
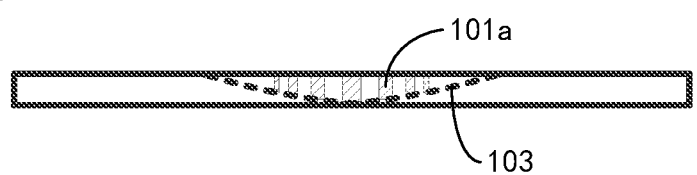
FIG. 4 is a sectional view of the second implementation of the panel support structure provided by the embodiments of the application.

One embodiment of the application provides a panel support structure. As shown in FIG. 1 and FIG. 2 which are structural diagrams of the panel support structure, the panel support structure comprises: at least one bent part 100 comprising a through hole area 102 and a blind hole area 101.

The through hole area 102 is located in the middle of the bent part 100, and at least one through hole 102a is formed in the through hole area 102.

The blind hole area 101 is located around the through hole area 102, at least one blind hole 101a is formed in the blind hole area 101, and the depths of the blind holes 101a are decreased in a direction away from the through hole area 102.

In this embodiment, the bent part 100 of the panel support structure is provided with the blind hole area 101 and the through hole area 102, so that good bending performance is provided under the condition that certain support strength is guaranteed, and a lightweight design of display products is realized.

Compared with the blind holes 101a, the through holes 102a are able to provide better bending performance, so the through hole area 102 is disposed in the middle of the bent part 100 to meet a higher requirement for the bending performance of the middle of the bent part 100 to improve the bending performance of the panel support structure, thus improving the bending performance of display products.

Compared with the through holes 102a, the blind holes 101a are able to provide higher support strength, so the blind hole area 101 is disposed around the through hole area 102 to meet a lower requirement for the bending performance of an area except for the middle of the bent part 100 and provide more sufficient support strength to support and protect a display panel of display products.

In this embodiment, the through hole area 102 is located in the middle of the bent part 100, the blind hole area 101 is located around the through hole area 102, and the depths of the blind holes 101a in the blind hole area 101 are decreased in the direction away from the through hole area 102, so that the area with a large bending amplitude close to the middle of the bent part 100 obtains better bending performance, and the area with a small bending amplitude away from the middle of the bent part 100 obtains more sufficient support strength.

Optionally, the panel support structure may be made of a stainless steel sheet or a high-molecular polymer with certain strength, the strength may be preset strength.

Optionally, the blind holes 101a are arranged in an array.

Optionally, the through holes 101a are arranged in an array.

Specifically, the blind holes 101a or the through holes 102a may be arranged in a honeycomb array or in an array shaped like Chinese character "pin" to make the bending performance of the panel support structure uniform. In addition, the specific shape of the blind holes 101a or the through holes 102a is not limited, and may be circular, rectangular, triangular or other polygonal shapes, or even a special shape.

In some feasible implementations, as shown in FIG. 3, FIG. 4, FIG. 8, FIG. 11 and FIG. 14, the panel support structure may only comprise at least one blind hole area 101 and not comprise the through hole area 102, and the depths of the blind holes 101a in the blind hole area 101 are decreased in the direction away from the middle of the bent part 100. In this way, good bending performance is provided under the condition that certain support strength is guaranteed, a lightweight design of display products is realized, the area with a large bending amplitude close to the middle of the bent part 100 obtains better bending performance, and the area with a small bending amplitude away from the middle of the bent part 100 obtains more sufficient support strength.

The inventor of the application considers that the bending amplitude of the bent part 100 of the panel support structure is generally decreased in the direction away from the middle of the bent part 100, so the application provides the following feasible implementation for the panel support structure:

As shown in FIG. 1-FIG. 5, in one embodiment of the application, the bent part 100 is bent along a bend axis 104, a connecting line of projections of the bottoms of the blind holes 101a in a first plane 140 is an arc line 103, and the first plane 140 is perpendicular to the bend axis 104 of the panel support structure.

In this embodiment, the depths of the blind holes 101a are more likely to be decreased approximately linearly or uniformly in the direction away from the middle of the bent part 100 to realize a uniform change of the bending performance of all portions of the bent part 100 of the panel support structure, thus meeting the requirements for the bending performance of all the portions of the bent part 100.

Optionally, the arc line 103 may be a circular arc line, or an arc line 103 with a variable curvature radius.

Optionally, the configuration that the connecting line of the projections of the bottoms of the blind holes 101a in the first plane 140 is an arc line 103 may specifically comprise, but is not limited to, a case where the projections of the bottoms of the blind holes 101a fall within the arc line 103, or a case where at least part of the projections of the bottoms of the blind holes 101a in the first plane 140 overlap or intersect with the arc line 103.

Optionally, the arc line 103 is tangent to a projection line of an inner surface 110 of the bent part 100 in the first plane 140, and a tangent point may be located at an opening of one through hole 102a in the inner surface 110 of the bent part 100, such as an opening of the through hole 102a in the middle of the bent part 100 in the inner surface 110.

Figure 5:
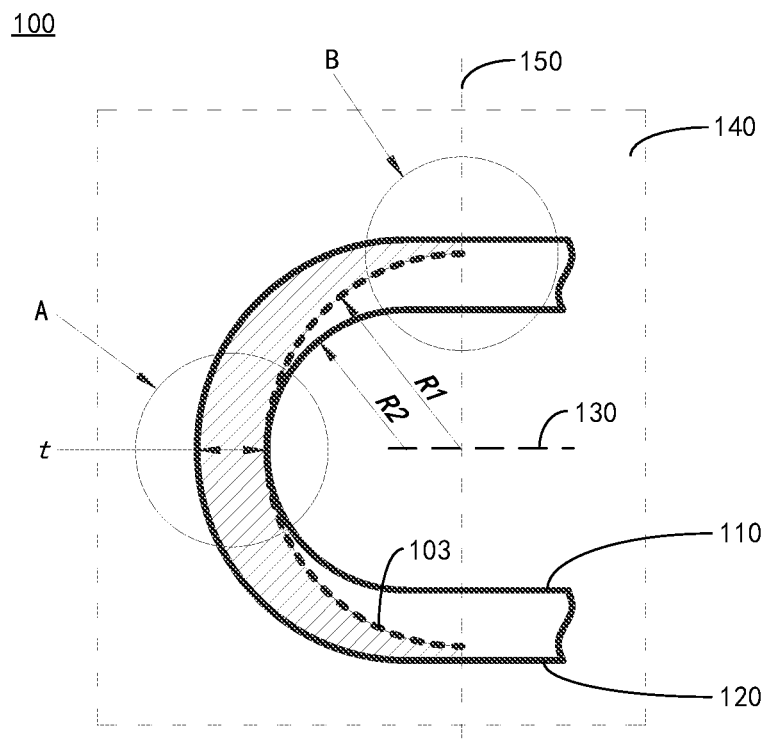
FIG. 5 is a schematic diagram of a bent part in a U-shaped state according to a third implementation of the panel support structure provided by the embodiments of the application.
Figure 6:
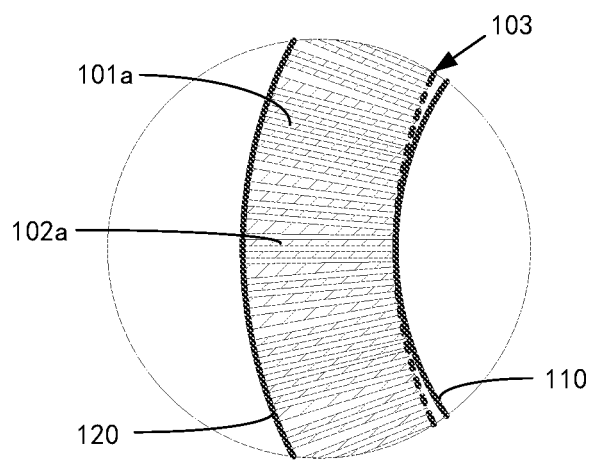
FIG. 6 is an enlarged view of part A in FIG. 5.
Figure 8:
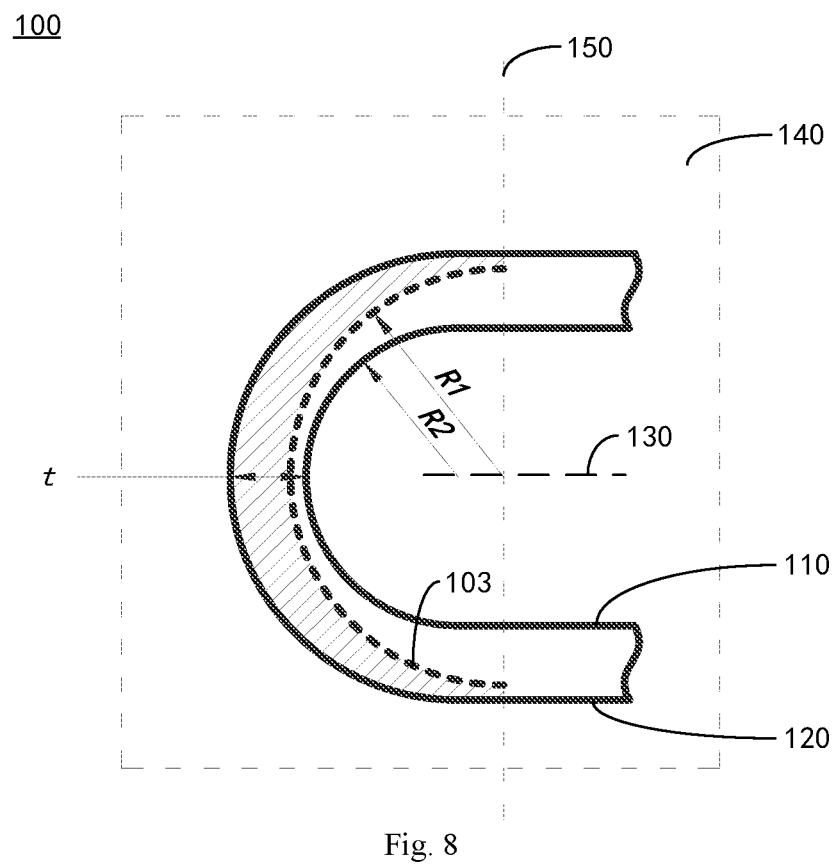
FIG. 8 is a schematic diagram of a bent part in a U-shaped state according to a fourth implementation of the panel support structure provided by the embodiments of the application.
Figure 9:
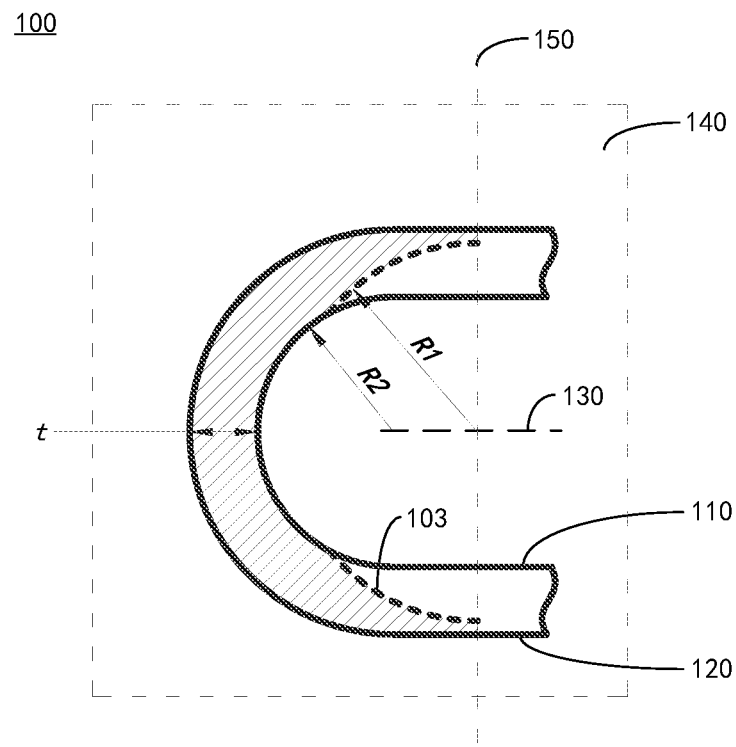
FIG. 9 is a schematic diagram of a bent part in a U-shaped state according to a fifth implementation of the panel support structure provided by the embodiments of the application.

In some feasible implementations, based on the embodiment where the bent part 100 is bent along the bend axis 104, the connecting line of the projections of the bottoms of the blind holes 101a in the first plane 140 is the arc line 103 and the first plane 140 is perpendicular to the bend axis 104 of the panel support structure, the arc line 103 has any one of the following features when the bent part 100 is in a U-shaped state:

Optionally, as shown in FIG. 5, FIG. 8 or FIG. 9, a minimum distance between the arc line 103 and a projection line of an outer surface 120 of the bent part 100 in the first plane 140 is greater than zero. That is, the arc line 103 is close to the outer surface 120 of the bent part 100, but is not tangent to and does not intersect with the outer surface 120 of the bent part 100.

In this embodiment, the decrease amplitude of the depths of the blind holes 101a in the blind hole area 101 in the direction away from the through hole area 102 is smaller than that in any one of the embodiments shown in FIG. 10-FIG. 15, so the difference in bending performance of all portions in the blind hole area 101 of the bent part 100 is small.

Figure 10:
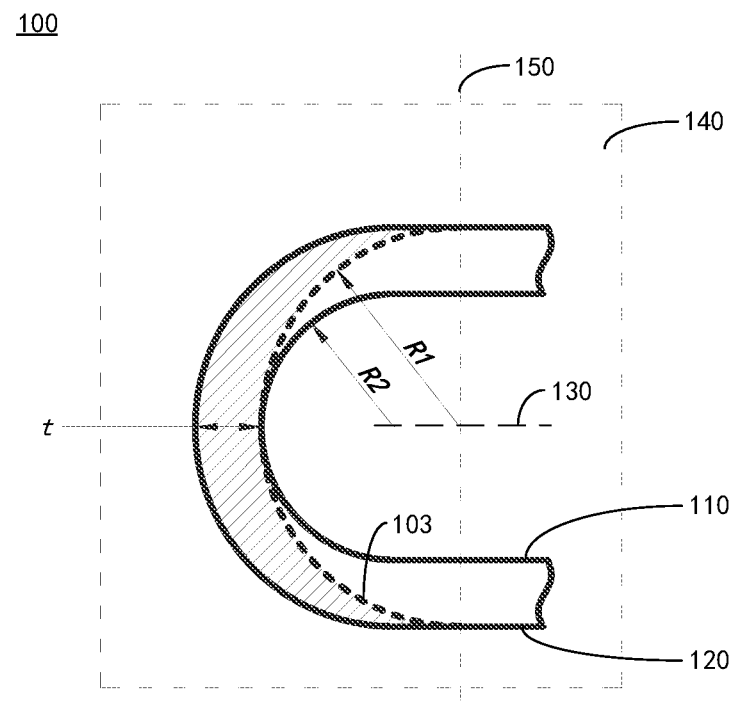
FIG. 10 is a schematic diagram of a bent part in a U-shaped state according to a sixth implementation of the panel support structure provided by the embodiments of the application.
Figure 11:
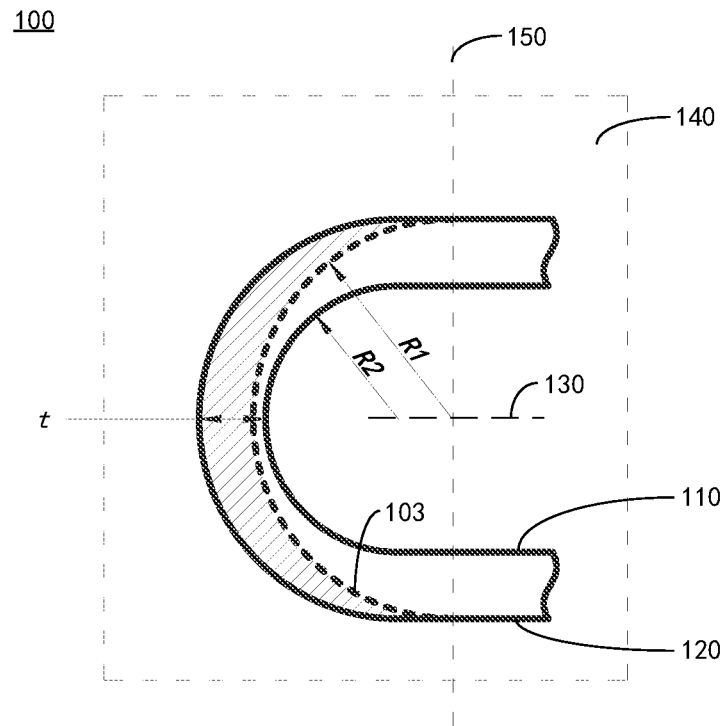
FIG. 11 is a schematic diagram of a bent part in a U-shaped state according to a seventh implementation of the panel support structure provided by the embodiments of the application.
Figure 12:
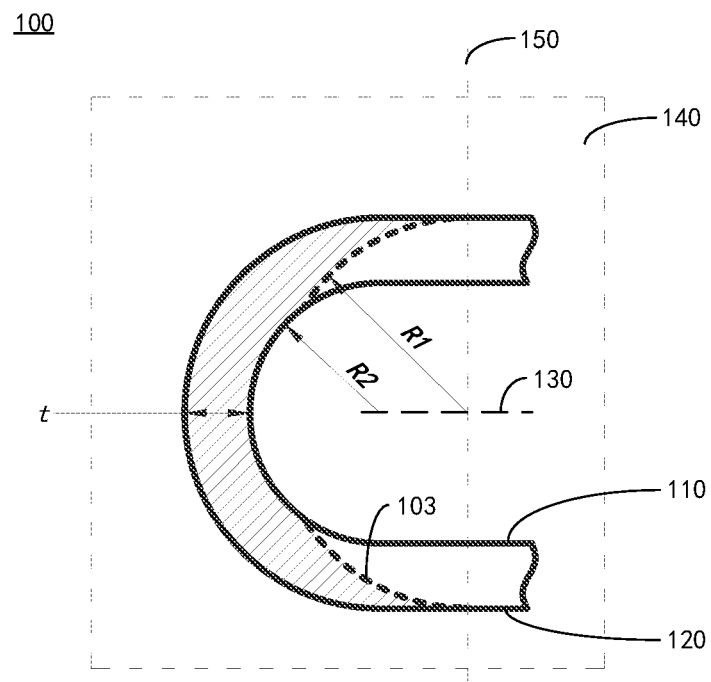
FIG. 12 is a schematic diagram of a bent part in a U-shaped state according to an eighth implementation of the panel support structure provided by the embodiments of the application.

Optionally, as shown in FIG. 10, FIG. 11 or FIG. 12, the arc line 103 is tangent to the projection line of the outer surface 120 of the bent part 100 in the first plane 140.

In this embodiment, the decrease amplitude of the depths of the blind holes 101a in the blind hole area 101 in the direction away from the through hole area 102 is greater than that in the embodiment shown in FIG. 5, FIG. 8 or FIG. 9, so the difference in bending performance of all portions in the blind hole area 101 of the bent part 100 is large.

Figure 13:
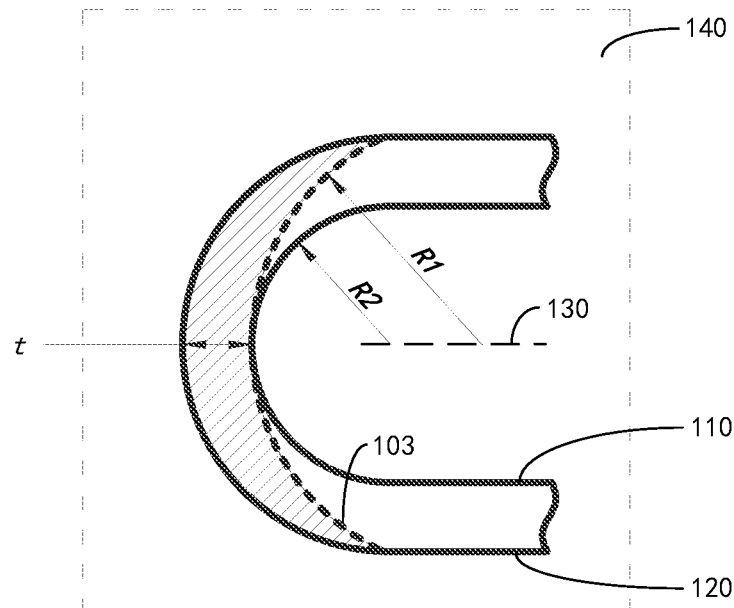
FIG. 13 is a schematic diagram of a bent part in a U-shaped state according to a ninth implementation of the panel support structure provided by the embodiments of the application.
Figure 14:
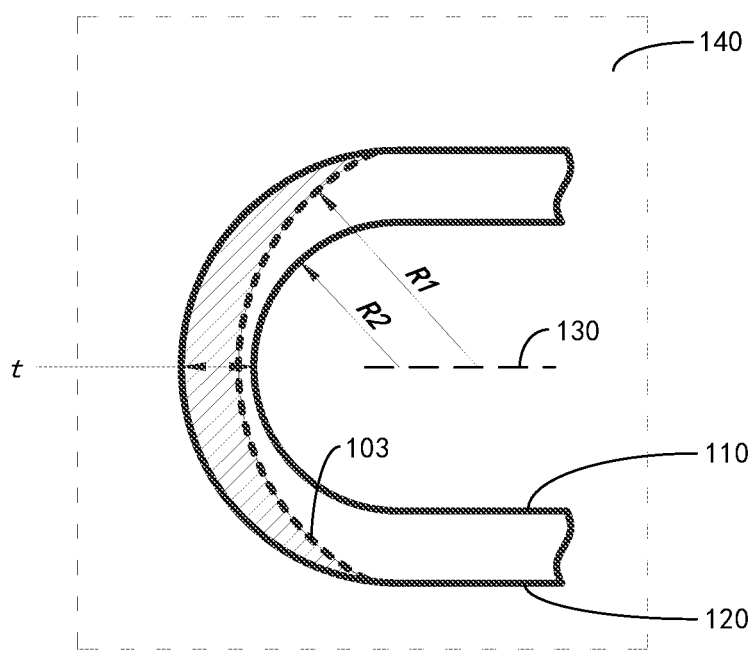
FIG. 14 is a schematic diagram of a bent part in a U-shaped state according to a tenth implementation of the panel support structure provided by the embodiments of the application.
Figure 15:
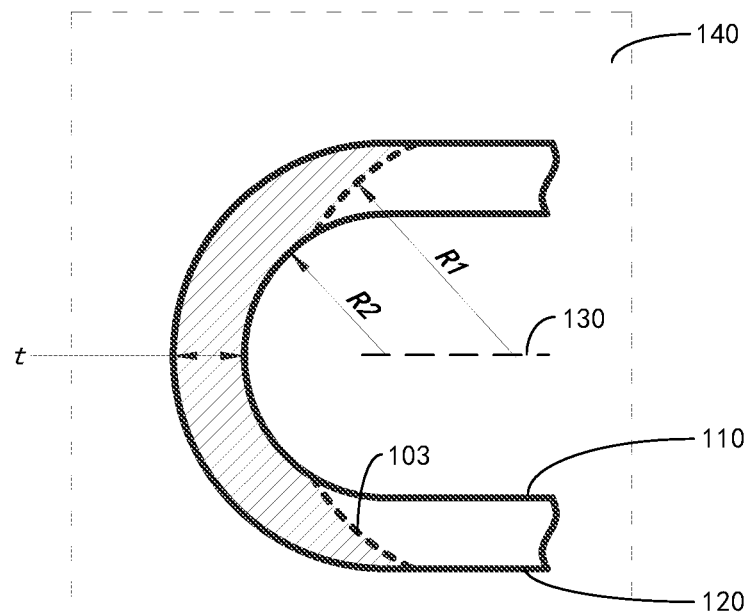
FIG. 15 is a schematic diagram of a bent part in a U-shaped state according to an eleventh implementation of the panel support structure provided by the embodiments of the application.

Optionally, as shown in FIG. 13, FIG. 14 or FIG. 15, the arc line 103 intersects with the projection line of the outer surface 120 of the bent part 100 in the first plane 140.

In this embodiment, the decrease amplitude of the depths of the blind holes 101a in the blind hole area 101 in the direction away from the through hole area 102 is much greater than that in the embodiment shown in FIG. 10, FIG. 11 or FIG. 12, so the difference in bending performance of all portions in the blind hole area 101 of the bent part 100 is much larger.

Optionally, as shown in FIG. 5, FIG. 10 or FIG. 13, the arc line 103 is tangent to the projection line of the inner surface 110 of the bent part 100 in the first plane 140.

In this embodiment, the tangent point of the arc line 103 and the projection line of the inner surface 110 of the bent part 100 in the first plane 140 corresponds to the through hole area 102, so the through hole area 102 is much smaller than the blind hole area 101. It can be understood that the size of the through hole area 102 may be slightly greater than that of the tangent point. For example, only one or several rows of through holes are formed in the through hole area 102 in a direction parallel to the bend axis 104 of the panel support structure.

Optionally, as shown in FIG. 9, FIG. 12 or FIG. 15, the arc line 103 intersects with the projection line of the inner surface 110 of the bent part 100 in the first plane 140.

In this embodiment, the arc line 103 may intersect with the projection line of the inner surface 110 of the bent part 100 to form two intersection points, and an area between the two intersection points corresponds to the through hole area 102, so the through hole area 102 in this embodiment is larger than the through hole area 102 in the previous embodiment.

It can be understood that with the departing of the intersection point between the arc line 103 and the projection line of the inner surface 110 of the bent part 100 in the first plane 140 from the middle of the bent part 100, the proportion of the through hole area 102 in the bent part 100 will become larger, that is, the proportion of the blind hole area 101 will become smaller.

In some feasible implementations, based on the embodiment where the bent part 100 is bent along the bend axis 104, the connecting line of the projections of the bottoms of the blind holes 101a in the first plane 140 is the arc line 103 and the first plane 140 is perpendicular to the bend axis 104 of the panel support structure, a difference between the curvature radius of the arc line 103 and the curvature radius of the inner surface 110 of the bent part 100 is m times of the thickness of the panel support structure when the bent part 100 is in a U-shaped state, and $0.67 \leq m \leq 1.5$. As shown in FIG. 5, R1 is the curvature radius of the arc line 103, R2 is the curvature radius of the inner surface 110, t is the thickness of the panel support structure, and R1−R2=mt.

Figure 7:
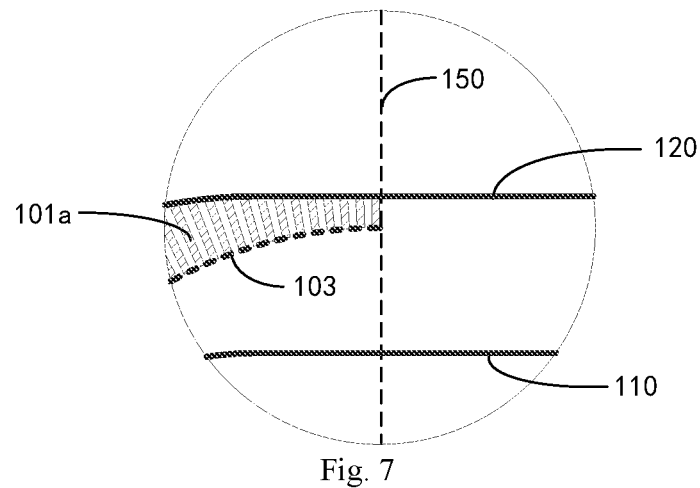
FIG. 7 is an enlarged view of part B in FIG. 5.

Optionally, in a state where the arc line is tangent to the projection line of the inner surface 110 of the bent part 100 in the first plane 140, when $0.67 \leq m < 1$, the arc line 103 may be close to the outer surface 120 of the bent part 100, but is not tangent to and does not intersect with the outer surface 120 of the bent part 100, as shown in FIG. 5 and FIG. 7.

Optionally, in a state where the arc line 103 is tangent to the projection line of the inner surface 110 of the bent part 100 in the first plane 140, when m=1, the arc line 103 may be tangent to the outer surface 120 of the bent part 100, as shown in FIG. 10.

Optionally, in a state where the arc line 103 is tangent to the projection line of the inner surface 110 of the bent part 100 in the first plane 140, when $1 < m \leq 1.5$, the arc line 103 may intersect with the outer surface 120 of the bent part 100, as shown in FIG. 13.

Optionally, in a state where the arc line 103 is tangent to the projection line of the outer surface 120 of the bent part 100 in the first plane 140, when $0.67 \leq m < 1$, the arc line 103 may be close to the inner surface 110 of the bent part 100, but is not tangent to and does not intersect with the inner surface 110 of the bent part 100, as shown in FIG. 11, that is a minimum distance between the arc line 103 and the projection line of the inner surface 110 of the bent part 100 in the first plane 140 is greater than zero.

Optionally, in a state where the arc line 103 is tangent to the projection line of the outer surface 120 of the bent part 100 in the first plane 140, when m=1, the arc line 103 may be tangent to the inner surface 110 of the bent part 100, as shown in FIG. 10.

Optionally, in a state where the arc line 103 is tangent to the projection line of the outer surface 120 of the bent part 100 in the first plane 140, when $1 < m \leq 1.5$, the arc line 103 may intersect with the inner surface 110 of the bent part 100, as shown in FIG. 12.

In some feasible implementations, based on the embodiment where the bent part 100 is bent along the bend axis 104, the connecting line of the projections of the bottoms of the blind holes 101a in the first plane 140 is the arc line 103 and the first plane 140 is perpendicular to the bend axis 104 of the panel support structure, the blind holes 101a are all located in a first area (not shown) of the bent part 100 when the curvature radius of the arc line 103 is not greater than that of the outer surface 120 of the bent part 100, as shown in FIG. 5 and FIG. 7-FIG. 12, wherein the first area is a C-shaped area truncated by a second plane 150 when the bent part 100 is in a U-shaped state, the second plane 150 passes through the center of the arc line 103 and is perpendicular to a symmetry plane 130 of the bent part 100, and the symmetry plane 130 passes through the bend axis 104. That is, the area, provided with the bind holes 101a, of the bent part 100 ends at the junction of the second plane 150 and the bent part 100. In this way, the blind holes 101a are restrained in an area within a large bending amplitude, such as in the bent part 100 or in an area close to the middle of the bent part 100, and will not reduce the support strength of an area with a small bending amplitude. Specifically, the first area shown in FIG. 5 is a C-shaped area, located on the left side of the second plane 150, of the bent part 100.

The inventor of the application considers that the areas on two sides of the middle of the bent part 100 of the panel support structure should have equilibrium bending performance in some application scenarios, so the application provides the following feasible implementation for the panel support structure:

As shown in FIG. 5 and FIG. 8-FIG. 15, in one embodiment of the application, the center of the arc line 103 and the center of the projection line of the inner surface 110 of the bent part 100 in the first plane 140 are both located on an intersection line of the symmetry plane 130 of the bent part 100 and the first plane 140 when the bent part 100 is in a U-shaped state, and the symmetry plane 130 passes through the bend axis 104.

By adoption of the technical solution provided by this embodiment, the contours, in the areas on two sides of the middle of the bent part 100, of the arc line 103 are symmetrical, that is, the depths of the blind holes 101a in the areas on the two sides of the middle of the bent part 100 are decreased symmetrically, so the areas on the two sides of the middle of the bent part 100 of the panel support structure obtain equilibrium bending performance.

In some feasible implementations, based on the embodiment where the center of the arc line 103 and the center of the projection line of the inner surface 110 of the bent part 100 in the first plane 140 are both located on the intersection line of the symmetry plane 130 of the bent part 100 and the first plane 140 when the bent part 100 is in a U-shaped state, and the symmetry plane 130 passes through the bend axis 104, the center of the projection line of the outer surface 120 of the bent part 100 in the first plane 140 is also located on the intersection line of the symmetry plane 130 of the bent part 100 and the first plane 140 when the bent part 100 is in the U-shaped state. That is, the center of the arc line 103, the center of the projection line of the inner surface 110 of the bent part 100 in the first plane 140, and the center of the projection line of the outer surface 120 of the bent part 100 in the first plane 140 are all located on the intersection line of the symmetry plane 130 of the bent part 100 and the first plane 140.

Figure 16:
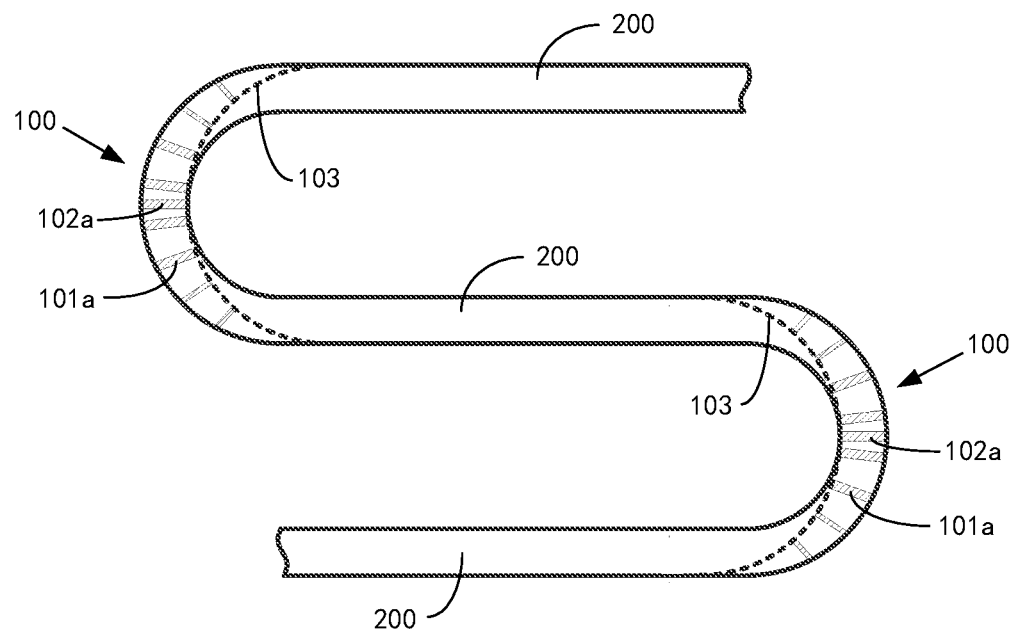
FIG. 16 is a schematic diagram of a bent part in a U-shaped state according to a twelfth implementation of the panel support structure provided by the embodiments of the application.

In some feasible implementations, as shown in FIG. 16, when the panel support structure comprises two or more bent parts 100, openings of the blind holes 101a of every two adjacent bent parts 100 are opposite to each other. In this way, the panel support structure can be bent in an S shape, which makes it possible to bend curved display products or bendable display products in an S shape.

In some feasible implementations, as shown in FIG. 17, when the panel support structure comprises two or more bent parts 100, openings of the blind holes 101a of every two adjacent bent parts 100 face each other. In this way, the panel support structure can be bent from the middle, which makes it possible to possible to bend curved display products or bendable display products from the middle.

The inventor of the application considers that the curved display products or bendable display products may have a display area that does not need to be bent, so the application provides the following feasible implementation for the panel support structure:

As shown in FIG. 16 or FIG. 17, the panel support structure in one embodiment of the application further comprises at least one non-bent part 200, wherein each non-bent part 200 is connected to at least one bent part 100.

In some feasible implementations, one bent part 100 is connected between every two adjacent non-bent parts 200, so that the two adjacent non-bent parts 200 can be folded relatively.

It should be noted that in the embodiments of the panel support structure show in FIG. 5, FIG. 8 and FIG. 9, the minimum distance between the arc line 103 and the outer surface 120 of the panel support structure is not zero when the bent part 100 is in a U-shaped state. Specifically, in FIG. 5, the arc line 103 is tangent to the inner surface 110 (that is, the through hole area 102 of the panel support structure is small); in FIG. 8, the minimum distance between the arc line 103 and the inner surface 110 is not zero (that is, the panel support structure does not have the through hole area 102, and only has the blind hole area 101); in FIG. 9, the arc line 103 intersects with the inner surface 110 (that is, the through hole area 102 of the panel support structure is large).

In the embodiments of the panel support structure shown in FIG. 10, FIG. 11 and FIG. 12, the arc line 103 is tangent to the outer surface 120 of the panel support structure when the bent part 100 is in a U-shaped state. Specifically, in FIG. 10, the arc line 103 is tangent to the inner surface 110 (that is, the through hole area 102 of the panel support structure is small); in FIG. 11, the minimum distance between the arc line 103 and the inner surface 110 is not zero (that is, the panel support structure does not have the through hole area 102, and only has the blind hole area 101); and in FIG. 12, the arc line 103 intersects with the inner surface 110 (that is, the through hole area 102 of the panel support structure is large).

In the embodiments of the panel support structure shown in FIG. 13, FIG. 14 and FIG. 15, the arc line 103 intersects with the outer surface 120 of the panel support structure when the bent part 100 are in a U-shaped state. Specifically, in FIG. 13, the arc line 103 is tangent to the inner surface 110 (that is, the through hole area 102 of the panel support structure is small); in FIG. 14, the minimum distance between the arc line 103 and the inner surface 110 is not zero (that is, the panel support structure does not have the through hole area 102, and only has the blind hole area 101); and in FIG. 15, the arc line 103 intersects with the inner surface 110 (that is, the through hole area 102 of the panel support structure is large).

Based on the same inventive concept, one embodiment of the application provides a displaying device. The displaying device comprises: a flexible display panel and the panel support structure provided by any one embodiment mentioned above, wherein the flexible display panel is located on one side of the panel support structure.

Optionally, the displaying device may be at least one of any curved display products or bendable display products such as a television, a digital photo frame, a mobile phone and a tablet personal computer, or relevant display components.

Optionally, the flexible display panel is attached to the outer surface 120 of the bent part 100, and the blind holes of the panel support structure are filled with elastic materials to form a flat layer.

Optionally, the flexible display panel is attached to the inner surface 110 of the bent part 100, and the blind holes of the panel support structure are not filled.

In some feasible implementations, the flexible display panel comprises an anode layer, a luminescent layer and a cathode layer which are stacked in sequence, wherein the anode layer is located on one side of the panel support structure. That is, the flexible display panel may be a display structure such as an LED display structure, a Micro-LED display structure, or an organic light-emitting diode (OLED) display structure.

In the above embodiments, because the displaying device adopts the panel support structure provided by any one above-mentioned embodiment, the principle and technical effects of the displaying device can be understood with reference to the above embodiments, and will no longer be detailed here.

Based on the same inventive concept, one embodiment of the application provides a manufacturing method of a panel support structure. As shown in FIG. 18, the manufacturing method comprises S101-S103:

S101: determining, according to the curvature radius of at least one bent part of a panel support structure and the thickness of the panel support structure, a guide line of the panel support structure when the bent part of the panel support structure is in a bent state.

In S101, the guide line may be determined by computer simulation.

S102: determining the depths and distribution areas of blind holes and through holes in the panel support structure according to the guide line, wherein a through hole area 102 is disposed in the middle of the bent part of the panel support structure, a blind hole area 101 is disposed around the through hole area 102, at least one through hole is formed in the through hole area 102, at least one blind hole is formed in the blind hole area 101, and the depths of the blind holes are decreased in a direction away from the through hole area 102.

By adoption of the solution in S102, the bent part 100 of the panel support structure obtained by a subsequent etching process is provided with the blind hole area 101 and the through hole area 102, so that good bending performance is provided under the condition that certain support strength is guaranteed, and a lightweight design of display products is realized. Or, the through hole area 102 is formed in the middle of the bent part of the panel support structure obtained by a subsequent etching process, and the blind hole area 101 is formed around the through hole area 102, and the depths of the blind holes 101a in the blind hole area 101 are decreased in a direction away from the through hole area 102, so that the area with a large bending amplitude close to the middle of the bent part 100 obtains better bending performance, and the area with a small bending amplitude away from the middle of the bent part 100 obtains more sufficient support strength.

In some feasible implementations, determining the depths and distribution areas of the blind holes and the through holes in the panel support structure according to the guide line comprises: matching an arc line formed by a connecting line of projections of the bottoms of the blind holes in a first plane and the guide line, wherein the first plane is perpendicular to a bend axis of the panel support structure. In this embodiment, the depths of the blind holes 101a are more likely to be decreased approximately linearly or uniformly in the direction away from the middle of the bent part 100 to realize a uniform change of the bending performance of all portions of the bent part 100 of the panel support structure, thus meeting the requirements for the bending performance of all the portions of the bent part 100.

In some feasible implementations, determining the depths and distribution areas of the blind holes and the through holes in the panel support structure according to the guide line further comprises, but is not limited to, the following five cases:

Optionally, when the bent part is in a U-shaped state, a minimum distance between the arc line and a projection line of an outer surface of the bent part in the first plane is greater than zero.

Optionally, when the bent part is in a U-shaped state, the arc line is tangent to the projection line of the outer surface of the bent part in the first plane.

Optionally, when the bent part is in a U-shaped state, the arc line intersects with the projection line of the outer surface of the bent part in the first plane.

Optionally, when the bent part is in a U-shaped state, the arc line is tangent to a projection line of an inner surface of the bent part in the first plane.

Optionally, when the bent part is in a U-shaped state, the arc line intersects with the projection line of the inner surface of the bent part in the first plane.

S103: etching the panel support structure according to the depths and the distribution areas of the blind holes and the through holes.

In S103, an obtained etching pattern of the blind hole area 101 may be divided into a plurality of sub-areas, and corresponding etching intensities are set for the sub-areas with different design depths to obtain blind holes with different depths. It can be understood that with the increase of the number of the sub-areas, the depth change of the blind holes 101a etched in the panel support structure will become finer, and the arc line 103 will be smoother.

The embodiments of the application have at least the following beneficial effects:

1. The bent part 100 of the panel support structure is provided with the blind hole area 101 and the through hole area 102, so that good bending performance is provided under the condition that certain support strength is guaranteed, and a lightweight design of display products is realized; in addition, the through hole area 102 is located in the middle of the bent part 100, the blind hole area 101 is located around the through hole area 102, and the depths of the blind holes 101a in the bind hole area are decreased in the direction away from the through hole area 102, so that the area with a large bending amplitude close to the middle of the bent part 100 obtains better bending performance, and the area with a small bending amplitude away from the bent part 100 obtains greater support strength.

2. The connecting line of the projections of the bottoms of the blind holes 101a in the first plane 140 is an arc line 103, and the first plane 140 is perpendicular to the bend axis 104 of the panel support structure, so that the depths of the blind holes 101a are more likely to be deceased approximate linearly or uniformly in the direction away from the middle of the bent part 100 to realize a uniform change of the bending performance of all portions of the bent part 100 of the panel support structure, thus meeting the requirements for the bending performance of all the portions of the bent part 100.

3. When the bent part 100 of the panel support structure is in a U-shaped state, different positional relations between the arc line 103 and the outer surface 120 or the inner surface 110 of the bent part 100 may provide different bending properties for the bent part 100.

4. When the curvature radius of the arc line 103 is not greater than that of the outer surface 120 of the bent part, the area, provided with the blind holes 101a, of the bent part 100 ends at the junction of the second plane 150 and the bent part 100, so the area provided with the blind holes 101a is restrained in the bent part and will not reduce the support strength of the bent part.

5. When the bent part 100 is in the U-shaped state, the center of the arc line 103 and the center of the projection line of the inner surface 110 of the bent part 100 in the first plane are both located on the intersection line of the symmetry plane 130 of the bent part 100 and the first plane 140; or, the center of the arc line 103, the center of the projection line of the inner surface 110 of the bent part 100 in the first plane 140, and the center of the projection line of the outer surface 120 of the bent part 100 in the first plane 140 are all located on the intersection line of the symmetry plane 130 of the bent part 100 and the first plane 140, so that the contours, in the areas on two sides of the middle of the bent part 100, of the arc line 103 are symmetrical, that is, the depths of the blind holes 101a in the areas on the two sides of the middle of the bent part 100, are decreased symmetrically, and thus, the areas on the two sides of the middle of the bent part 100 of the panel support structure obtain equilibrium bending performance.

Those skilled in the art would appreciate that terms such as "central", "upper", "lower", "front", "back", "left", "right", "vertical". "horizontal", "top", "bottom", "inner" and "outer" in the description of the application are used to indicate directional or positional relations based on the accompanying drawings merely for the purpose of facilitating and simplifying the description of the application, do not indicate or imply that devices or elements referred to must have a specific direction, or be configured and operated in a specific direction, and thus, should not be construed as limitations of the application.

The terms "first" and "second" are merely for the purpose of description, and should not be construed as indicating or implying relative importance or implicitly indicating the number of technical features referred to. Thus, a feature defined by "first" or "second" may explicitly or implicitly refer to the inclusion of one or more said feature. Unless otherwise specified, "multiple" in the description of the application refers to two or more.

It should be noted that, unless otherwise clearly stated and specified, the terms "install", "connect" and "connection" in the description of the application should be broadly understood. For example, "connection" may refer to fixed connection, detachable connection or integrated connection, or direct connection or indirect connection via an intermediate medium, or internal communication of two elements. Those ordinarily skilled in the art may appreciate the specific meanings of these terms in the application as the case may be.

The specific features, structures, materials or characteristics in the description of this specification may be combined in any one or more embodiments or examples in any appropriate manners.

The above embodiments are merely illustrative ones of the application. It should be pointed out that those ordinarily skilled in the art can make different improvements and embellishments without departing from the principle of the application, and all these improvements and embellishments should also fall within the protection scope of the application.

The invention claimed is:

1. A displaying device, wherein the displaying device comprises a flexible display panel and a panel support structure;

the flexible display panel is located on a side of the panel support structure such that the panel support structure provides support strength to support and protect the flexible display panel;

the panel support structure consists of a stainless steel sheet and comprises: at least one bent part comprising a through hole area and a blind hole area in the panel support structure;

the through hole area in the panel support structure is located in a middle of the bent part, and at least one through hole entirely penetrating through the panel support structure, from the side of the panel support structure to the other side of the panel support structure, is formed in the through hole area in the panel support structure; and the blind hole area in the panel support structure is located around the through hole area in the panel support structure, at least one blind hole is formed in the blind hole area in the panel support structure, and depths of the blind holes are decreased in a direction away from the through hole area in the panel support structure.

2. The displaying device according to claim 1, wherein the bent part is bent along a bend axis, a connecting line of projections of bottoms of the blind holes in a first plane is an arc line, and the first plane is perpendicular to the bend axis of the panel support structure.

3. The displaying device according to claim 2, wherein the arc line is a circular arc line, or an arc line with a variable curvature radius.

4. The displaying device according to claim 2, wherein the arc line is tangent to a projection line of an inner surface of the bent part in the first plane and a tangent point is formed, the tangent point is located at an opening of one through hole in the inner surface.

5. The displaying device according to claim 2, wherein the bent part is a U-shaped state, the arc line has any one of the following features:
  a minimum distance between the arc line and a projection line of an outer surface of the bent part in the first plane is greater than zero;
  the arc line is tangent to the projection line of the outer surface of the bent part in the first plane; and
  the arc line intersects with the projection line of the outer surface of the bent part in the first plane.

6. The displaying device according to claim 5, wherein a difference between a curvature radius of the arc line and a curvature radius of the inner surface of the bent part is m times of a thickness of the panel support structure, and $0.67 \leq m \leq 1.5$.

7. The displaying device according to claim 6, wherein in a state where the arc line is tangent to a projection line of an inner surface of the bent part in the first plane, when $0.67 \leq m < 1$, the minimum distance between the arc line and the projection line of the outer surface of the bent part in the first plane is greater than zero;
  when $m=1$, the arc line is tangent to the projection line of the outer surface of the bent part in the first plane; and
  when $1 < m \leq 1.5$, the arc line intersects with the projection line of the outer surface of the bent part in the first plane.

8. The displaying device according to claim 6, wherein in a state where the arc line is tangent to the projection line of the outer surface of the bent part in the first plane, when $0.67 \leq m < 1$, the minimum distance between the arc line and the projection line of an inner surface of the bent part in the first plane is greater than zero;
  when $m=1$, the arc line is tangent to a projection line of the inner surface of the bent part in the first plane; and
  when $1 < m \leq 1.5$, the arc line intersects with the projection line of the inner surface of the bent part in the first plane.

9. The displaying device according to claim 5, wherein in the case that a curvature radius of the arc line is not greater than that of the outer surface of the bent part, the blind holes are all located in a first area of the bent part, the first area is a C-shaped area truncated by a second plane, passes through a center of the arc line, and is perpendicular to a symmetry plane of the bent part, and the symmetry plane passes through the bend axis.

10. The displaying device according to claim 2, wherein the bent part is a U-shaped state, the arc line has any one of the following features:
  the arc line is tangent to a projection line of an inner surface of the bent part in the first plane; and
  the arc line intersects with the projection line of the inner surface of the bent part in the first plane.

11. The displaying device according to claim 2, wherein the bent part is in a U-shaped state, a center of the arc line and a center of a projection line of an inner surface of the bent part in the first plane are both located on an intersection line of a symmetry plane of the bent part and the first plane, and the symmetry plane passes through the bend axis.

12. The displaying device according to claim 11, wherein a center of a projection line of an outer surface of the bent part in the first plane is located on the intersection line of the symmetry plane of the bent part and the first plane.

13. The displaying device according to claim 1, wherein openings of the blind holes of two adjacent said bent parts are opposite to each other;
  or, the openings of the blind holes of two adjacent said bent parts face each other.

14. The displaying device according to claim 1, wherein the blind holes and the through holes are arranged in arrays.

15. The displaying device according to claim 1, wherein the panel support structure further comprises at least one non-bent part, each non-bent part is connected to at least one bent part.

16. The displaying device according to claim 2, wherein the projections of the bottoms of the blind holes in the first plane fall within the arc line, or at least part of the projections of the bottoms of the blind holes in the first plane overlap or intersect with the arc line.

17. A manufacturing method of the displaying device according to claim 1, comprising:
  manufacturing the panel support structure, wherein the manufacturing the panel support structure comprises:
    determining, according to a curvature radius of the at least one bent part of the panel support structure and a thickness of the panel support structure, a guide line of the panel support structure when the bent part of the panel support structure is in a bent state;
    determining depths and distribution areas of blind holes and through holes in the panel support structure according to the guide line, wherein the through hole area is located in a middle of the bent part of the panel support structure, the blind hole area is located around the through hole area, at least one said through hole is formed in the through hole area, at least one said blind hole is formed in the blind hole area, and the depths of the blind holes are decreased in the direction away from the through hole area; and etching the panel support structure according to the determined depths and distribution areas of the blind holes and the through holes.

18. The manufacturing method according to claim 17, wherein the step of determining depths and distribution areas of blind holes and through holes in the panel support structure according to the guide line comprises:

matching an arc line formed by a connecting line of projections of the bottoms of the blind holes in a first plane and the guide line, wherein the first plane is perpendicular to a bend axis of the panel support structure.

19. A displaying device, wherein the displaying device comprises a flexible display panel and a panel support structure;

the flexible display panel is located on a side of the panel support structure such that the panel support structure provides support strength to support and protect the flexible display panel;

the panel support structure consists of a high-molecular polymer with preset strength and comprises: at least one bent part comprising a through hole area and a blind hole area in the panel support structure;

the through hole area in the panel support structure is located in a middle of the bent part, and at least one through hole entirely penetrating through the panel support structure, from the side of the panel support structure to the other side of the panel support structure, is formed in the through hole area in the panel support structure; and the blind hole area in the panel support structure is located around the through hole area in the panel support structure, at least one blind hole is formed in the blind hole area in the panel support structure, and depths of the blind holes are decreased in a direction away from the through hole area in the panel support structure.

20. A manufacturing method of the displaying device according to claim 19, comprising:

manufacturing the panel support structure, wherein the manufacturing the panel support structure comprises:

determining, according to a curvature radius of the at least one bent part of the panel support structure and a thickness of the panel support structure, a guide line of the panel support structure when the bent part of the panel support structure is in a bent state;

determining depths and distribution areas of blind holes and through holes in the panel support structure according to the guide line, wherein the through hole area is located in a middle of the bent part of the panel support structure, the blind hole area is located around the through hole area, at least one said through hole is formed in the through hole area, at least one said blind hole is formed in the blind hole area, and the depths of the blind holes are decreased in the direction away from the through hole area; and etching the panel support structure according to the determined depths and distribution areas of the blind holes and the through holes.

* * * * *